United States Patent [19]

Imura et al.

[11] Patent Number: 4,556,583

[45] **Date of Patent: * Dec. 3, 1985**

[54] METHOD OF FABRICATING MAGNETIC BUBBLE MEMORY DEVICE

[75] Inventors: Ryo Imura, Sayama; Tadashi Ikeda, Kodaira; Teruaki Takeuchi, Kokubunji; Norio Ohta, Sayama; Yutaka Sugita, Tokorozawa, all of Japan

[73] Assignee: Hitachi, Ltd., Tokyo, Japan

[ * ] Notice: The portion of the term of this patent subsequent to Dec. 3, 1985 has been disclaimed.

[21] Appl. No.: 375,216

[22] Filed: May 5, 1982

[30] Foreign Application Priority Data

May 11, 1981 [JP] Japan .................................. 56-69441

[51] Int. Cl.[4] ........................ B05D 3/06; G11C 19/08

[52] U.S. Cl. ...................................... 427/38; 427/127; 365/36

[58] Field of Search ................. 427/38, 131, 130, 127; 204/192 N; 365/36; 357/91

[56] References Cited

U.S. PATENT DOCUMENTS 4,247,781 1/1981 Bayer et al. .................... 250/492 A

OTHER PUBLICATIONS

*IEEE Transactions on Magnetics,* vol. MAG-16, No. 1, Jan. 1980, pp. 93–98, Kie Y. Ahn et al., "Fabrication of Contiguous-Disk Magnetic Bubble Devices".

*Primary Examiner*—Norman Morgenstern
*Assistant Examiner*—Ken Jaconetty
*Attorney, Agent, or Firm*—Antonelli, Terry & Wands

[57] ABSTRACT

A method of fabricating a magnetic bubble memory device is disclosed in which a desired portion of a surface region in a magnetic bubble film for magnetic bubbles is implanted with hydrogen ions with an ion dose of $2.5\times10^{16}$ to $1\times10^{17}$ $cm^{-2}$, the surface of magnetic bubble film thus formed is covered with a film, and then the magnetic bubble film is annealed. According to this method, a reduction in propagation margin due to annealing is effectively prevented, and it is possible to form a magnetic bubble memory device of the contiguous disk type which is excellent in thermal stability.

22 Claims, 6 Drawing Figures

METHOD OF FABRICATING MAGNETIC BUBBLE MEMORY DEVICE

The present invention relates to a method of fabricating a magnetic bubble memory device, and more particularly to a method of forming an ion-implanted-layer (in other words, a strain layer) in a magnetic bubble memory device of the Contiguous Disk type (hereinafter referred to as a "CD device").

The present invention will become more apparent from the following detailed description taken in conjunction with the accompanying drawings, in which.

A CD device, as described in U.S. Pat. No. 3,828,329 and others, is characterized by having a contiguous disk bubble propagation circuit which is formed by implanting ions in a magnetic bubble film for magnetic bubbles. Since the propagation circuit has no gap, the CD device is considered to be well suited to form a magnetic bubble memory device of high bit density.

Figure 1:
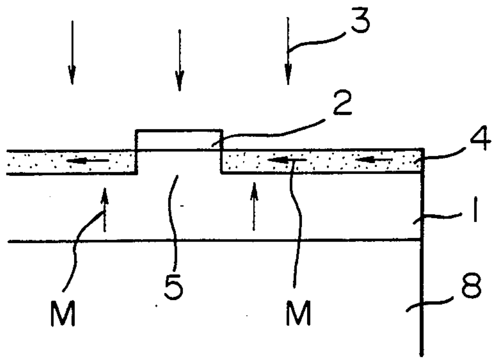
FIG. 1 is a schematic view for explaining the formation of an inplane magnetization layer by ion implantation.

As shown in FIG. 1, the contiguous disk bubble propagation circuit is formed in a manner that a mask 2 of a photoresist film or metal film is provided on a magnetic bubble film (such as monocrystalline magnetic garnet film) for magnetic bubbles which is formed on substrate (such as (111) oriented surface of $Gd_3Ga_5O_{12}$) 8, and then ions 3 such as hydrogen ions or $Ne+$ ions are implanted in the magnetic garnet film 1.

In more detail, strain is generated in the magnetic bubble film 1 by the above-mentioned ion implantation. Owing to the magnetostriction effect of the strain thus generated, magnetization M in an ion-implanted region is directed parallel to the surface of the film 1, and an in-plane magnetization layer thus formed (namely, an ion-implanted layer) 4 serves to form a propagation circuit 5.

Figure 2:
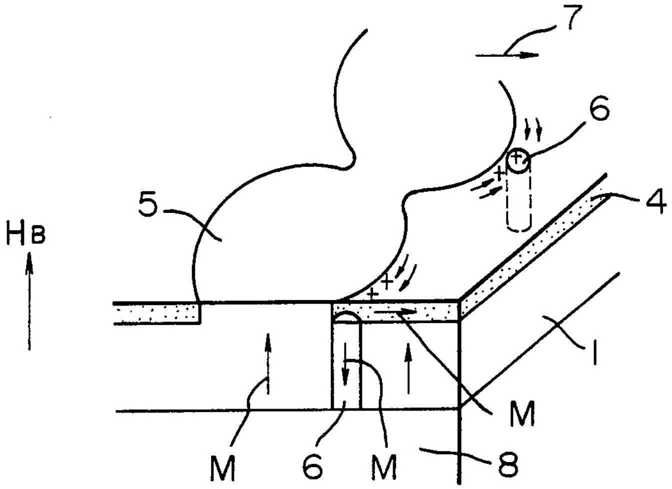
FIG. 2 is a schematic view for explaining the operation of a CD device.

The propagation circuit 5 is a region which has the form of contiguous disks and is not implanted with the ions. A charged wall having magnetic charges is formed on the periphery of the propagation circuit 5, and a magnetic bubble 6 adheres to the charged wall as shown in FIG. 2. The charged wall is moved along the edge of the propagation circuit 5 by an externally-applied rotating field 7, and the magnetic bubble 6 is thereby transferred.

Since the propagation circuit 5 has no gap as mentioned previously, it is expected that the bit density of a CD device can be made more than four times higher than that of an ordinary magnetic bubble memory device (that is, larger than about $4Mb/cm^2$) by utilizing the widely-used photolithography technique, and further it is expected that a magnetic field for driving magnetic bubbles can be greatly reduced.

An ion-implanted layer (namely, a strain layer) formed in a magnetic bubble film plays a very important role in a CD device, as mentioned above, and various kinds of ions can be used to form the strain layer at a desired portion of a surface region in the magnetic bubble film. However, it is obvious that a hydrogen ion is the best of these ions. Accordingly, in a conventional method, hydrogen ions are implanted in the desired portion with an ion dose of about $2\times10^{16}\ cm^{-2}$ or less to form the strain layer.

However, when CD devices are formed in such a manner that hydrogen ions are implanted in a magnetic garnet film at the above-mentioned ion dose and then the magnetic garnet film is annealed to smooth a strain distribution in a strain layer, characteristics of the CD devices vary widely, and therefore it is difficult to massproduce a CD device having a thermally stable characteristic in the above-mentioned manner.

It is accordingly an object of the present invention to provide a method of fabricating a magnetic bubble memory device in which a reliable CD device having a stable characteristic can be formed.

In order to attain the above object, according to the present invention, a predetermined amount of hydrogen ions is implanted in a desired portion of a surface region in a magnetic bubble film, then ion implanted magnetic bubble film is covered with an appropriate, evaporating or sputtering film such as an insulating film, a metal film, or a polycrystalline silicon film, and then the magnetic bubble film is annealed.

As mentioned previously, the propagation circuit of a CD device is formed by implanting ions selectively in a desired portion of a surface region in a magnetic bubble film, such as monocrystalline magnetic garnet film, for magnetic bubbles.

Figure 3:
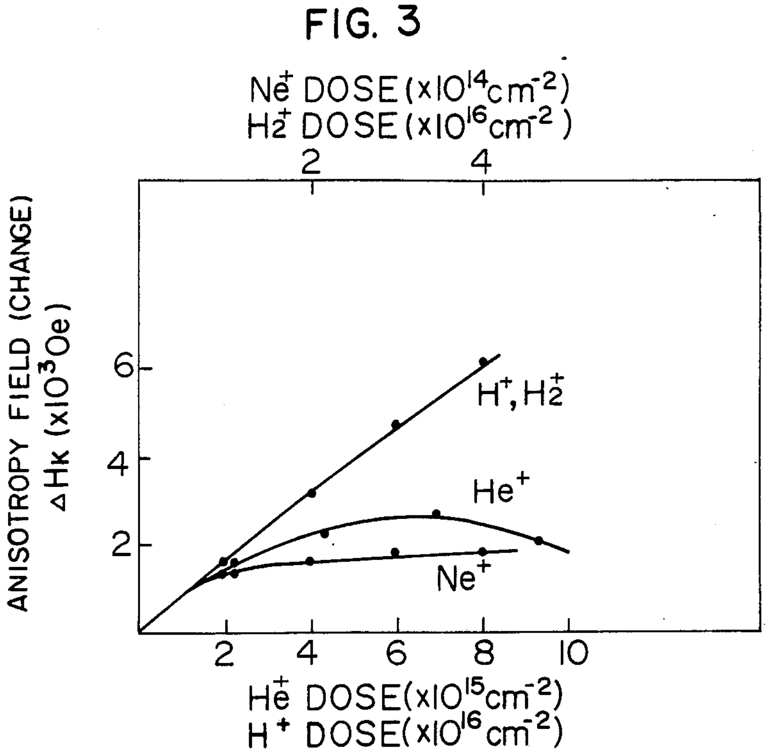
FIG. 3 is a graph showing relations between ion dosage and effective anisotropy field change $\Delta H_k$.

It has been found that when $He^{30}$ ions or $Ne^+$ ions are implanted in a magnetic bubble film, an inplane anisotropy field $\Delta H_k$ in the magnetic bubble film scarcely varies with ion dosage as shown in FIG. 3, and that when hydrogen ions are implanted in a magnetic bubble film, an inplane anisotropy field $\Delta H_k$ in the bubble film increases clearly with increasing ion dosage as compared with the case where $He^+$ ions or $Ne^+$ ions are implanted.

The present invention is based upon the abovementioned novel knowledge, and a gist of the present invention resides in that, after hydrogen ions have been implanted in a magnetic bubble film in very large amounts, that is, at an ion dose of about $2.5\times10^{16}$ to $1\times10^{17}\ cm^{-2}$, the surface of the bubble film is covered with a film for preventing the release of hydrogen ions, and then the bubble film is annealed.

Figure 4:
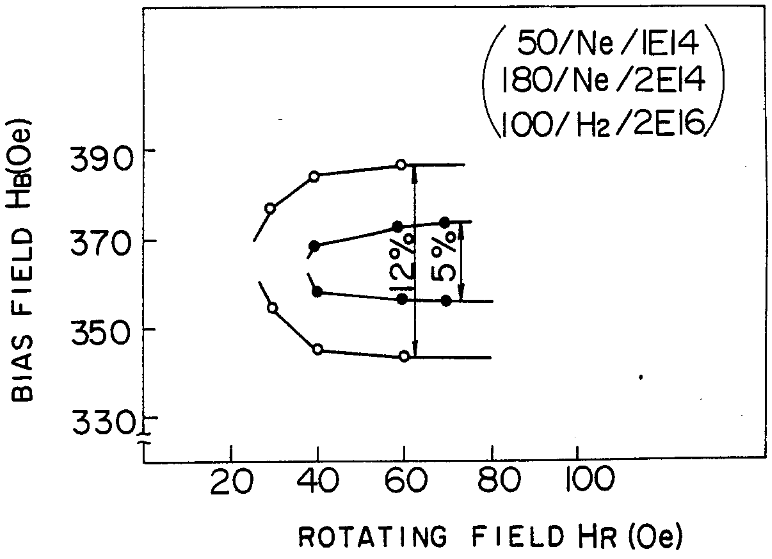
FIG. 4 is a graph showing a reduction in propagation margin due to annealing at a CD device according to a conventional fabricating method, by way of example.

FIG. 4 shows a reduction in propagation margin due to annealing in the case where an inplane magnetization layer is formed in a magnetic garnet film by the conventional method, by way of example. In this case, ion implantation has been carried out three times under conditions shown in the parenthesis of FIG. 4. In more detail, the lowermost term $100/H_2/2E16$ in the parenthesis means that $H_2^+$ ions having an implantation energy of 100 KeV have been implanted in a magnetic garnet film with an ion dose of $2\times10^{16}\ cm^{-2}$, and the uppermost and intermediate terms indicate similar contents. Incidentally, $Ne^+$ ions have been implanted in the magnetic garnet film to smooth a strain distribution therein. Accordingly, a bias field $H_B$ applied to and an inplane anisotropy field $\Delta H_k$ formed in the magnetic garnet film are determined substantially by the hydrogen ions, and are not affected by the $Ne^+$ ions. In FIG. 4 marks o and • indicate measured values at a time before annealing and measured values at a time after the magnetic garnet ($(YSmLuCa)_3(FeGe)_5O_{12}$ or $(YSmLuGd)_3$ $(FeGa)_5O_{12}$) film has been annealed at 400° C. for a half hour, respectively.

As is apparent from FIG. 4, a propagation margin (that is, a range of bias field in which magnetic bubbles can be driven satisfactorily) before annealing is about 12%, but a propagation margin after the above-mentioned annealing is only about 5%. That is, the propagation margin is reduced greatly by annealing.

The annealing carried out after ion implantation aims at smoothing a strain distribution produced in a magnetic garnet film by ion implantation, and usually the magnetic garnet film is annealed at a temperature in the vicinity of 400° C.

In the convention method, the propagation margin is reduced considerably by the annealing carried out at temperatures on the order of 400° C., as mentioned above, and therefore annealing temperature is obliged to be made low. As a result of low annealing temperature, the thermal stability of an inplane magnetization layer formed in a magnetic garnet film is very low.

According to the present invention, such an undesirable hindrance is effectively prevented as mentioned below.

Figure 5:
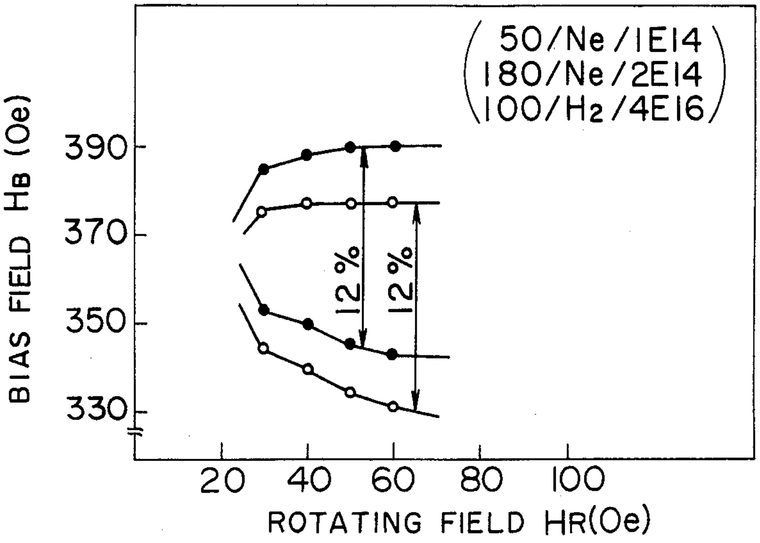
FIG. 5 is a graph showing propagation margins before and after annealing at a CD device according to the present invention, by way of example.

FIG. 5 shows a propagation margin of a magnetic garnet film which has the same composition as the case shown in FIG. 4 and has been implanted with hydrogen ions having an energy of 100 KeV at an implant dose of $4\times10^{16}$ cm$^{-2}$ in accordance with the present invention, at a time before annealing, and a propagation margin at a time after an ion-implanted region of the above-mentioned magnetic garnet film has been covered with an $SiO_2$ film having a thickness of 1000 Å and the magnetic garnet film provided with the $SiO_2$ film has been annealed at 400° C. for a half hour. In FIG. 5, marks o and • indicate measured values at a time before annealing and those at a time after the above-mentioned annealing, respectively.

As is apparent from FIG. 5, propagation margins before and after annealing are both equal to 12%. That is, a reduction in propagation margin due to annealing can be effectively prevented by the present invention.

As mentioned above, the present invention is characterized in that a larger amount of hydrogen ions than in the conventional method is implanted in a magnetic bubble film, an ion-implanted region of the bubble film is covered with an appropriate film, and then the bubble film is annealed, in order to prevent a reduction in propagation margin due to annealing and make it possible to provide a magnetic bubble memory device which is excellent in thermal stability.

Needless to say, it is desirable to make the propagation margin of a magnetic bubble memory device as high as possible, and the propagation margin is preferably made equal to or greater than about 7 to 8% from a practical point of view.

When the implant dose of hydrogen ions is less than about $2.5\times10^{16}$ cm$^{-2}$, it is difficult to make the propagation margin equal to or greater than 7%. Therefore, it is necessary to implant hydrogen ions in a magnetic bubble film at an implant dose of $2.5\times10^{16}$ cm$^{-2}$ or more.

The propagation margin increases as the ion dose of hydrogen ions is larger. When the ion dose is greater than $1\times10^{17}$ cm$^{-2}$, not only an ion-implanted layer becomes amorphous, but also Curie temperature of the ion-implanted layer is greatly reduced. Such an ion-implanted layer is unfavorable from a practical point of view. Accordingly, it should be avoided to make the ion dose of hydrogen ions larger than $1\times10^{17}$ cm$^{-2}$.

For this reason, it is required in the present invention to put the ion dose of hydrogen ions (namely, $H_2^+$ ion, $H^+$ ion, $D_2^+$ or $D^+$ ion) in a range from about $2.5\times10^{16}$ to about $1\times10^{17}$ cm$^{-2}$.

Figure 6:
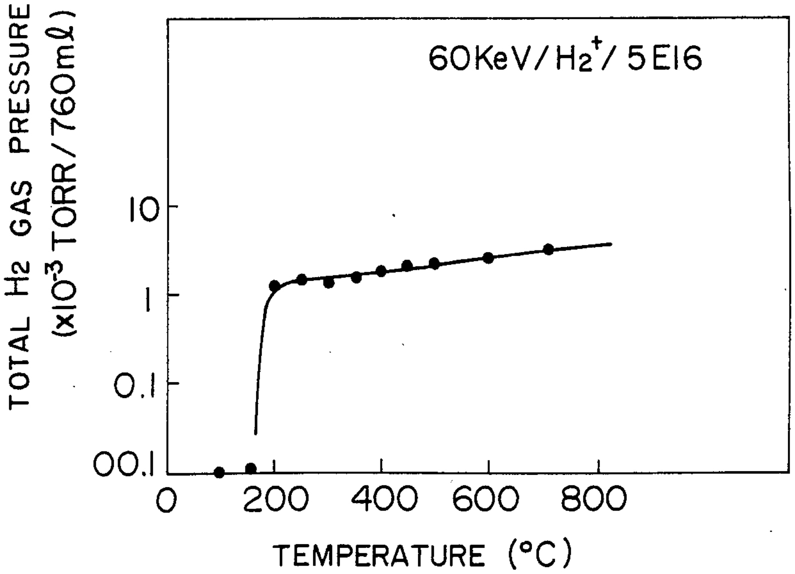
FIG. 6 is a graph showing a relation between the temperature of a magnetic bubble film which is just being implanted with hydrogen ions, and the amount of hydrogen gas release from the magnetic bubble film.

In order to implant such a large amount of hydrogen ions in a magnetic bubble film, it is desirable to use a well-known, high-current ion implanter in which, for example, a plurality of samples (in this case, magnetic bubble films) mounted on a rotary table are successively implanted with ions by turning the rotary table, to prevent the temperature of each sample from rising. By using such a high-current ion implanter, it is possible to rapidly implant a large amount of hydrogen ions in a magnetic bubble film without producing an excessive temperature rise of the bubble film, and without any release of hydrogen ions from the bubble film and any reduction in anisotropy field $\Delta H_k$ each caused by the excessive temperature rise of the magnetic bubble film at the ion implantation time. In the case where the temperature of an ion-implanted region at the ion implantation time is high, particularly higher than 200° C. a considerable amount of hydrogen ions release from the ion-implanted region, as shown in FIG. 6. However, when the high-current ion implanter is used, there is no danger of such unfavorable phenomenon being generated.

In the present invention, only hydrogen ions may be implanted in a magnetic bubble film to form a strain layer. However, in addition to the hydrogen ion, $He^+$ ion and $Ne^+$ ion may be implanted in the bubble film to smooth a strain distribution in the direction of depth. As shown in FIG. 3, the dependence of the anisotropy field $\Delta H_k$ on the implant dose of hydrogen ions is larger than the dependence of $\Delta H_k$ on the implant dose of Hehu + ions and $Ne^+$ ions, and therefore the anisotropy field $\Delta H_k$ is scarcely affected by the $He^+$ ions and $Ne^+$ ions implanted in the strain layer.

A magnetic bubble film is annealed after having been implanted with ions, in order to smooth a strain distribution in an ion-implanted layer, that is, for the sake of thermal stabilization of the ion-implanted layer. Accordingly, the thermal stability of a CD device increases as annealing temperature is higher. In an ordinary case, the magnetic bubble film is annealed at about 350°-800° C., favorable results are obtained by annealing the magnetic bubble film at a temperature in the vicinity of 400° C.

An appropriate film is provided on the surface of magnetic bubble film region prior to annealing, in order to prevent release of hydrogen ions due to annealing and to prevent a reduction in propagation margin caused by the release of hydrogen ions. Accordingly, the above-mentioned film may be one of an insulating film such as $SiO_2$, $Si_3N_4$ or $Al_2O_3$, a metal film such as aluminum, nickel, chromium, titanium, or an alloy of these elements, and a polycrystalline silicon film.

An insulating film having a thickness of about 50 Å or more and smaller than about 10,000 Å can effectively prevent the release of hydrogen ions. Especially, an $SiO_2$ film having a thickness of about 500 to 3000 Å can serve as an insulating film for a CD device and also, in addition to acting as a release preventing film, and therefore is very useful from a practical point of view.

As has been explained in the foregoing, according to the present invention, it is possible to rapidly form a CD device which is excellent in thermal stability and high in propagation margin. It is needless to say that a magnetic garnet film which is made of one of well-known bubble materials for magnetic bubble devices and is epitaxially grown on a (111) crystallographic plane of monocrystalline $Gd_3Ga_5O_{12}$, can be used as a magnetic garnet film in the present invention. Further, in addition to the magnetic garnet film, orthoferrite or amorphous Ge-Co films or other kinds of films capable of supporting magnetic bubbles may be used as the magnetic bubble film in the present invention.

What is claimed is:

1. In a method of fabricating a magnetic bubble memory device comprising the steps of implanting ions in a desired portion of a surface region in a magnetic bubble film for magnetic bubbles and annealing said magnetic bubble film, the improvement comprising:

wherein said implanting is performed using hydrogen ions and is performed by placing said magnetic bubble film on a rotary table and, while said rotary table is turning, implanting hydrogen ions in said desired portion of the surface region in said magnetic bubble film for magnetic bubbles with an ion dose of $2.5\times10^{16}$ to $1\times10^{17}$ $cm^{-2}$ to form an ion-implanted layer, the implanting while turning the rotary table acting to prevent the temperature of the magnetic bubble film from rising so that the temperature of the magnetic bubble film is not higher than a predetermined temperature when said ion implantation is effected, whereby release of hydrogen ions from the bubble film and reduction in anisotropy field $\Delta H_k$ caused by excessive temperature rise of the magnetic bubble film during ion implantation are prevented;

and wherein a film is formed on said magnetic bubble film to cover said magnetic bubble film prior to annealing said magnetic bubble film, said annealing being performed to smooth a strain distribution in said ion-implanted layer.

2. A method according to claim 1, wherein said film formed on said magnetic bubble film is selected from a group consisting of an insulating film, a metal film, an alloy film and a polycrystalline silicon film.

3. A method according to claim 2, wherein said insulating film has a thickness substantially equal to or more than 50 Å.

4. A method according to claim 3, wherein said insulating film is an $SiO_2$ film having substantially a thickness of 50 to 10,000 Å.

5. A method according to claim 1, 2, 3 or 4, wherein said magnetic bubble film is annealed substantially at 350°-800° C.

6. A method according to claim 1, wherein said predetermined temperature is 200° C.

7. In a method of fabricating a magnetic bubble memory device comprising the steps of implanting ions in a desired portion of a surface region in a magnetic bubble film for magnetic bubbles and annealing said magnetic bubble film, the improvement comprising:

wherein said implanting is performed using hydrogen ions and is performed by placing a magnetic bubble film on a rotatable table opposite an ion-implanter, wherein said ion-implanter emits ions which bombard said magnetic bubble film as said magnetic bubble film is periodically positioned to receive ions from said ion-implanter; and by implanting hydrogen ions in said desired portion of the surface region in said magnetic bubble film for magnetic bubbles with an ion dose of $2.5\times10^{16}$ to $1\times10^{17}$ $cm^{-2}$ to form an ion-implanted layer, while rotating said rotatable table, the implanting while rotating the rotatable table acting to prevent the temperature of the magnetic bubble film from rising so that the temperature of said magnetic bubble film is not higher than a predetermined temperature when said ion implantation is effected, whereby the release of hydrogen ions from the magnetic bubble film and reduction in anisotropy field $\Delta H_k$ caused by excessive temperature rise of the magnetic bubble film during the implanting is prevented;

and wherein a film is formed on said magnetic bubble film to cover said magnetic bubble film prior to annealing, said annealing being performed to smooth a strain distribution in said ion-implanted layer.

8. A method according to claim 7 wherein said predetermined temperature is 200° C.

9. A method according to claim 7, wherein the propagation margin remains constant throughout said fabrication of said magnetic bubble device.

10. A method according to claim 9, wherein the propagation margin is equal to or greater than 7%.

11. A method according to claim 7, wherein said film formed on said magnetic bubble film is selected from a group consisting of an insulating film, a metal film, an alloy film and a polycrystalline silicon film.

12. A method according to claim 11, wherein said insualating film has a thickness substantially equal to or more than 50 Å.

13. A method according to claim 12, wherein said insulating film is an $SiO_2$ film having substantially a thickness of 50 to 10,000 Å.

14. A method according to claim 7, wherein said magnetic bubble film is annealed substantially at 350°-800° C.

15. A method according to claim 7, wherein said magnetic bubble film is annealed substantially at 400° C.

16. A method according to claim 7, wherein said hydrogen ions implanted in said magnetic bubble film have an energy of 100 KeV.

17. A method according to claim 11, wherein said insulating film is at least one compound selected from the group consisting of $SiO_2$, $Si_3N_4$ or $Al_2O_3$.

18. A method according to claim 11 wherein said metal film is at least one element selected from the group consisting of: aluminum, nickel, chromium or titanium.

19. A method according to claim 1, wherein, in addition to said hydrogen ions, ions of at least one of helium and neon are also implanted in said magnetic bubble film.

20. A method according to claim 7, wherein, in addition to said hydrogen ions, ions of at least one of helium and neon are also implanted in said magnetic bubble film.

21. A method according to claim 1, wherein said film formed on said magnetic bubble film is a film for preventing release of hydrogen ions due to annealing.

22. A method according to claim 7, wherein said film formed on said magnetic bubble film is a film for preventing release of hydrogen ions due to annealing.

* * * * *

UNITED STATES PATENT AND TRADEMARK OFFICE

CERTIFICATE OF CORRECTION

PATENT NO. : 4,556,583

DATED : December 3, 1985

INVENTOR(S) : Imura et al.

It is certified that error appears in the above-identified patent and that said Letters Patent is hereby corrected as shown below:

On the Title Page, left-hand column:

"[*] Notice: The portion of the term of this patent subsequent to Dec. 3, 1985 has been disclaimed."

should read:

-- [*] Notice: The portion of the term of this patent subsequent to Dec. 3, 2002 has been disclaimed. --

Signed and Sealed this

*Twelfth* Day of *August 1986*

[SEAL]

*Attest:*

DONALD J. QUIGG

*Attesting Officer*

*Commissioner of Patents and Trademarks*